United States Patent
Son et al.

(10) Patent No.: US 7,265,989 B2
(45) Date of Patent: Sep. 4, 2007

(54) PC CARD

(75) Inventors: Masayoshi Son, Tokyo (JP); Satoru Yoshikawa, Kounan (JP)

(73) Assignees: Softbank BB Corp., Tokyo (JP); Suncorporation, Kounan-shi (JP)

( * ) Notice: Subject to any disclaimer, the term of this patent is extended or adjusted under 35 U.S.C. 154(b) by 0 days.

(21) Appl. No.: 10/551,845

(22) PCT Filed: Apr. 7, 2004

(86) PCT No.: PCT/JP2004/005033

§ 371 (c)(1),
(2), (4) Date: Jun. 27, 2006

(87) PCT Pub. No.: WO2004/090699

PCT Pub. Date: Oct. 21, 2004

(65) Prior Publication Data

US 2006/0289619 A1 Dec. 28, 2006

(30) Foreign Application Priority Data

Apr. 8, 2003 (JP) .............................. 2003-104251

(51) Int. Cl.
*H05K 9/00* (2006.01)

(52) U.S. Cl. ................. 361/737; 361/753; 361/799; 361/800; 235/492; 235/441; 439/945; 439/946

(58) Field of Classification Search ................ 361/737, 361/728, 730, 752, 753, 799, 800, 816, 818, 361/814; 235/441, 492; 439/945, 946; 343/700 MS; 455/90.3; 174/350, 351

See application file for complete search history.

(56) References Cited

U.S. PATENT DOCUMENTS

| | | | | |
|---|---|---|---|---|
| 5,517,387 A | * | 5/1996 | Smith | 361/686 |
| 5,846,092 A | * | 12/1998 | Feldman et al. | 439/76.1 |
| 6,008,994 A | * | 12/1999 | Bates | 361/737 |
| 6,122,175 A | * | 9/2000 | Shieh | 361/737 |
| 6,224,391 B1 | * | 5/2001 | Horie et al. | 439/64 |
| 6,327,154 B1 | * | 12/2001 | Gauld et al. | 361/737 |
| 6,337,797 B1 | * | 1/2002 | Huang | 361/737 |
| 6,413,108 B2 | * | 7/2002 | Centofante | 439/267 |
| 6,574,112 B2 | * | 6/2003 | Washino et al. | 361/752 |
| 6,903,935 B1 | * | 6/2005 | Chen | 361/737 |
| 7,059,913 B1 | * | 6/2006 | Chen | 439/638 |

FOREIGN PATENT DOCUMENTS

| | | |
|---|---|---|
| JP | 3071278 | 3/1991 |
| JP | 2001-186563 | 7/2001 |
| JP | 2001-223814 | 8/2001 |

(Continued)

*Primary Examiner*—Dameon E. Levi
(74) *Attorney, Agent, or Firm*—Oblon, Spivak, McClelland, Maier & Neustadt, P.C.

(57) ABSTRACT

A PC card is provided which can be used to add multiple capabilities to an information processing apparatus in cooperation with a conventional card only by the use of a single card slot.

The PC card 1 comprises a card main body 10 which is provided with a connection plug 11 for connecting with the information processing apparatus 20 and a card connector 12 through which an additional card 30 can be connected, and which is connected to the information processing apparatus 20 to add multiple capabilities to the information processing apparatus; a pair of parallel rail members 13 serving to guide the additional card 30 for insertion; and a bridge member 14 connected between said pair of parallel rail members in order not to block the insertion path.

5 Claims, 7 Drawing Sheets

FOREIGN PATENT DOCUMENTS

| | | |
|---|---|---|
| JP | 2002-300068 | 10/2002 |
| JP | 2003-015775 | 1/2003 |
| JP | 2003-045574 | 2/2003 |
| JP | 2004-135236 | 4/2004 |

\* cited by examiner (a)

(b)

(a)

(b)

PC CARD

TECHNICAL FIELD

The present invention relates to a PC card which can be used to add multiple capabilities to an information processing apparatus.

BACKGROUND ART

A PC card provides a wireless LAN capability, a PHS communication capability, a portable telephone communication capability, a memory capability and so forth, and can be plugged into an information processing apparatus such as a personal computer to make use of these capabilities. In order to add multiple capabilities to an information processing apparatus, a plurality of PC cards have to be plugged into the information processing apparatus, and therefore a plurality of slots must be available for connection. As conventional personal computers have been downsized, in many models, particularly laptop personal computers, there is only one slot for a PC card to enable a functional extension.

On the other hand, the technique is disclosed that a plurality of PC cards are linked in series so that multiple capabilities can be added to a personal computer only by the use of a single slot (for example, refer to Japanese Patent Published Application No. Hei 2000-75974, paragraph "0025", FIG. 1).

However, in the case where a plurality of PC cards are simply connected to each other, they can be easily disconnected and therefore it is not practical. In addition, the PC cards must have a special structure for the serial connection, and therefore conventional cards cannot be used.

Taking into consideration the above shortcomings, it is an object of the present invention to provide a PC card which can be used to add multiple capabilities to an information processing apparatus in cooperation with a conventional card only by the use of a single card slot.

SUMMARY OF THE INVENTION

In order to accomplish the above object, the first feature of the present invention resides in a PC card comprising: (a) a card main body having a connection plug connectable to an information processing apparatus, and a card connector through which an additional card can be connected to add multiple capabilities to the information processing apparatus; (b) a pair of parallel rail members configured to guide the additional card for insertion; and a bridge member connected between the pair of parallel rail members in order not to block the insertion path. In this description, a "PC card" is a card which is inserted into an information processing apparatus to add a certain capability such as a wireless capability or a memory capability to the information processing apparatus. Such an information processing apparatus may be a personal computer (PC), a notebook type personal computer, or any other appropriate device such as a cellular phone, a PHS, a PDA, an electronic organizer, a digital camera, a car navigation system, a scanner, or a printer.

The PC card in accordance with the first feature of the present invention serves to add multiple capabilities to an information processing apparatus in cooperation with a conventional card only by the use of a single card slot.

Also, the rail members of the PC card in accordance with the first feature of the present invention may be provided with a flame ground contact for inserted card which comes in contact with a flame ground contact of the additional card and serves to ground the additional card and the PC card to the information processing apparatus. flame ground contact In accordance with this PC card, since the FG contacts of the additional card and the PC card are integrally formed, the cost of the parts can be reduced without the need for assembling process. Particularly, in the case of products which handle high frequency signals, it is an important issue for improving the performance to connect FG contacts, and therefore it contributes to the stabilization of the high frequency performance. Furthermore, when the card is touched such that static electricity charged on the human body is discharged, the static electricity as discharged could damage electronic elements inside of the card. However, since the card is connected to the case of an information processing apparatus such as the PC through the FG contacts, harmful effects of the static electricity can be substantially lessened.

Also, in accordance with the first feature, a radio communication capability may be implemented in the card main body of the PC card with a wireless antenna located in the bridge member. In accordance with this PC card, it is possible to add a wireless radio communication capability and the capability of the additional card to the information processing apparatus.

The bridge member of the PC card in accordance with the first feature is provided therein with a wiring for high frequency signals to be connected to the wireless antenna, and a wiring for LED indicator. In accordance with this PC card, even if the space available for wiring in the rail member is small, the wirings for the antenna and the LED can be drawn into the bridge member. In addition to this, since a single shared cable is used to transmit two signals, it is possible to reduce the parts cost of wiring and the number of steps for arranging wirings.

Also, the bridge member of the PC card in accordance with the first characteristics may comprise: a movable antenna unit provided with the wireless antenna; and a bridge frame member configured to connect between the rail members. In accordance with this PC card, the radio receiving condition can be improved by setting the movable antenna unit in the upright position. Also, the LED indicator is located on the movable antenna unit so that it is possible to improve the visibility of LED indication.

Furthermore, the card connector of the PC card in accordance with the first feature is a male connector, and the PC card in accordance with the first feature may be provided further with a dummy card serving to protect the card connector. In this description, a "dummy card" is a card which is used to cover the card connector, and is provided with no function therein. In accordance with this PC card, it is possible to protect the card connector by the cheap dummy card. Also, even when no additional card is inserted into the PC card, no foreign object enters through the card connector so that there is no fear of damaging the electronic circuits inside of the product. Also, when no additional card is inserted, the appearance of the PC card can be improved from aesthetic point of view.

Incidentally, the additional card may be a PHS card. In this case, if the PC card in accordance with the first feature of the present invention has a wireless LAN capability, both the wireless LAN capability and the PHS capability can be added to the information processing apparatus.

BEST MODE FOR CARRYING OUT THE INVENTION

Figure 1:
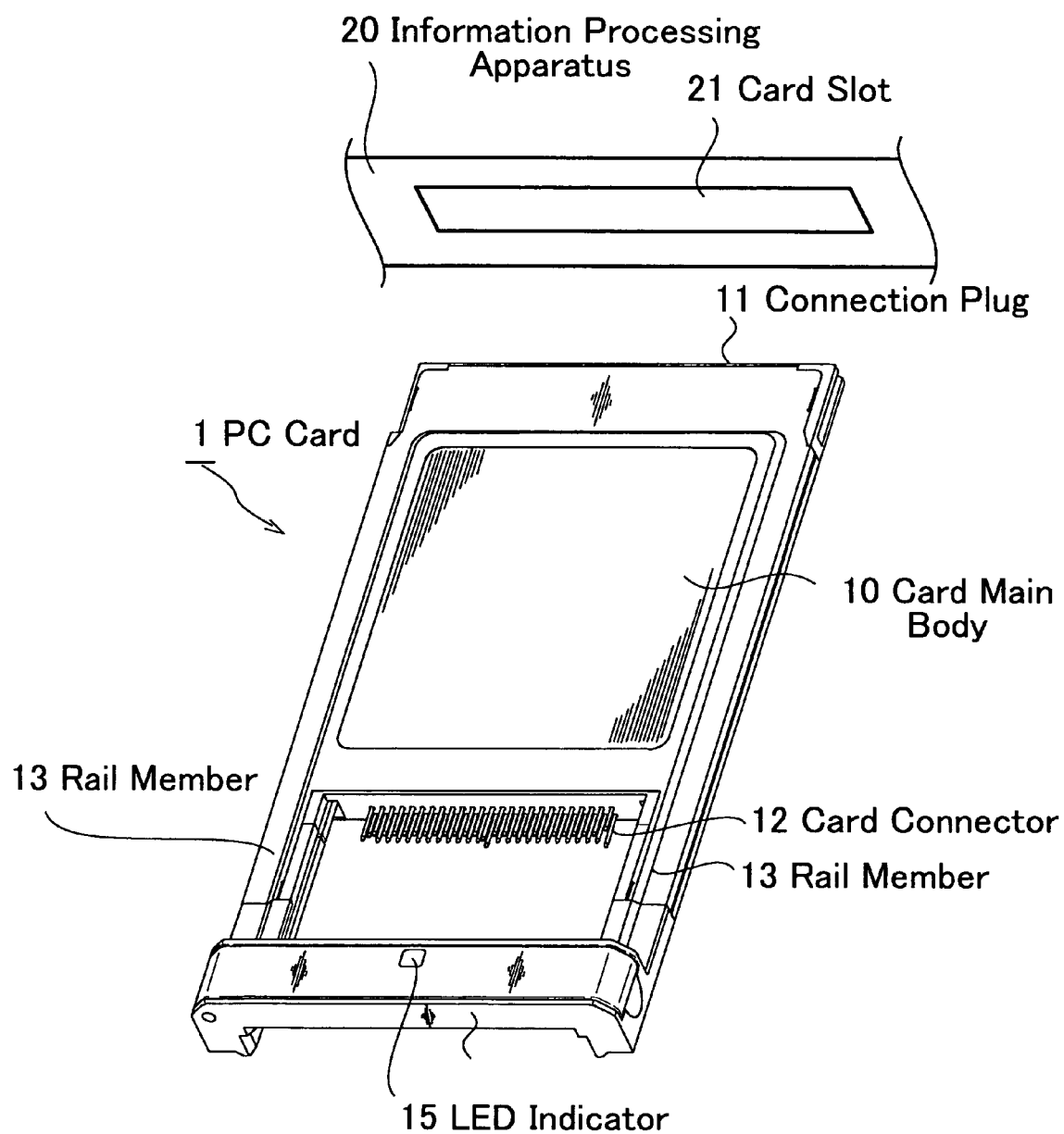
FIG. 1 is a perspective view showing a PC card in accordance with a first embodiment.

Next, with reference to drawings, the first and second embodiments in accordance with the present invention will be explained. Throughout the following drawings, like references indicate functionally same or similar elements. It should be noted that the drawings are presented only schematically such that, in the drawings, the relationship between the thicknesses and the plane dimensions, and the proportions of the respective layers are not those in practice. Accordingly, the actual thicknesses and dimensions should be determined taking into consideration the following description. Also, needless to say, the relationship and the proportions are not exactly illustrated also in terms of the correspondence among the respective drawings.

First Embodiment (Outer Configuration of A PC Card)

The PC card in accordance with the first embodiment of the present invention comprises a card main body 10 to be inserted into a card slot 21 of an information processing apparatus 20, a pair of parallel rail members 13, and a bridge member 14 with which the pair of the rail members 13 are connected as illustrated in FIG. 1.

The card main body 10 is provided with a connection plug 11 for connecting with the information processing apparatus 20, and a card connector 12 to which an additional card can be connected. The card main body 10 is provided with a capability implemented therein such as a wireless LAN capability, a PHS communication capability, a portable telephone communication capability, a memory capability or the like, and serves to add multiple capabilities including the capability of the additional card to the information processing apparatus 20.

Figure 2:
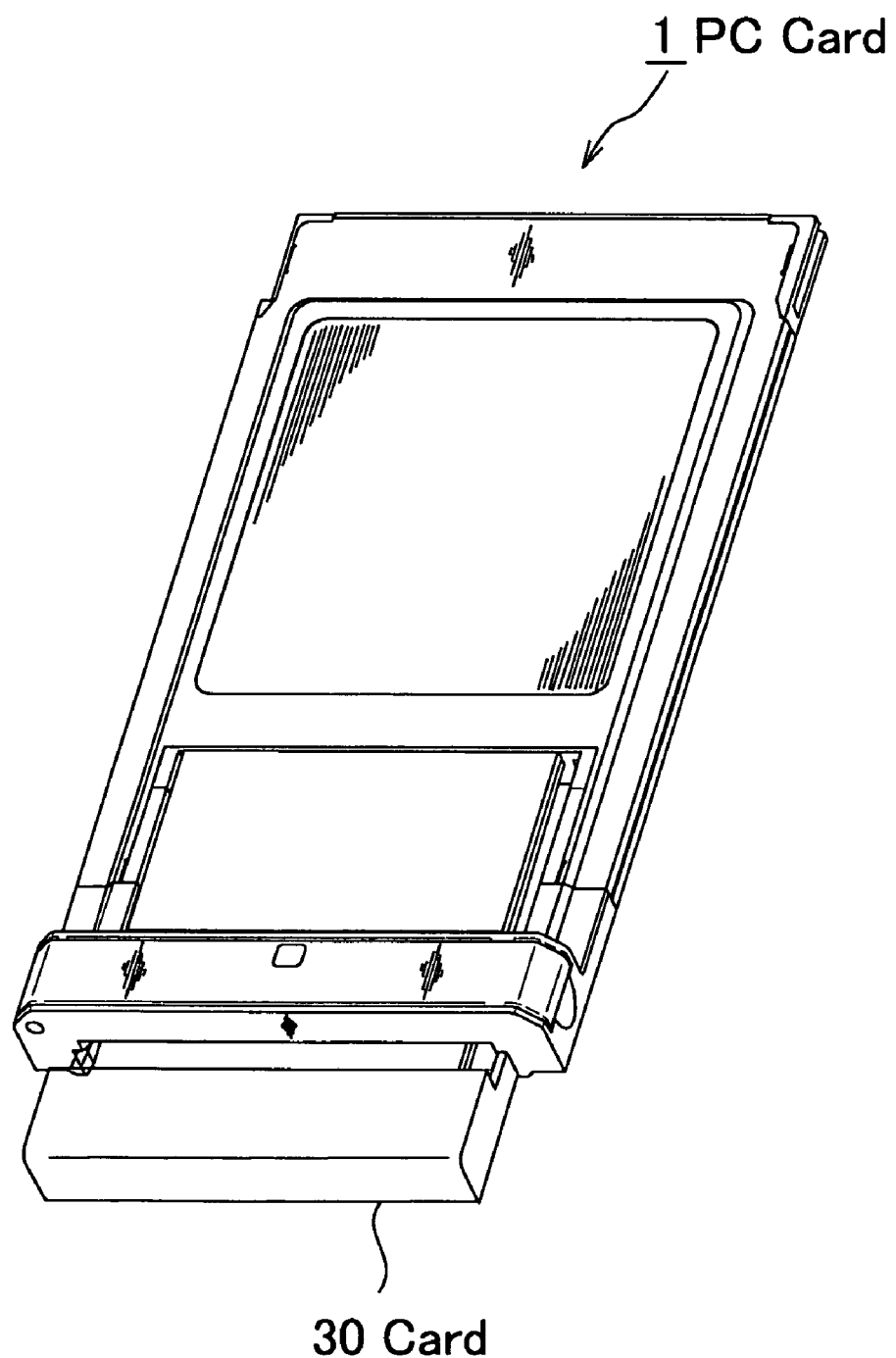
FIG. 2 is a view showing the PC card in accordance with the first embodiment into which an additional card is inserted.

The rail members 13 is used to guide the additional card for insertion. FIG. 2 shows the PC card 1 into which an additional card 30 is inserted. The additional card 30 is inserted into the PC card 1 along the rail members 13, and connected to the card connector 12.

The bridge member 14 is located in order not to block the insertion path of the additional card 30 when the additional card 30 is inserted between the rail members 13. Since the bridge member 14 is provided, it is possible to enhance the stiffness of the rail members 13 and the ability of holding the card 30 as inserted.

The additional card 30 as inserted is preferably a CF Type I or CF Type II card designed in compliance with the CFA (Compact Flash Association) standard. More specifically speaking, a Compact Flash (registered trademark) card (CF card) and a PHS card can be used.

The standard size of CF Type I is 36.4 mm length×42.8 mm width×3.3 mm thickness, and the standard size of CF Type II is 36.4 mm length×42.8 mm width×5.0 mm thickness. The PC card 1 in accordance with the first embodiment is provided with the card connector 12 in conformity with this type of the card 30, and the rail members 13 and the bridge member 14 can be designed to hold any card in compliance with this standard. For example, FIG. 6(a) is a cross sectional view taken along B-B line of FIG. 4, and the width L9 of the portion into which the additional card 30 is inserted is preferably 42.8 to 50.0 mm or thereabout, the rail members 13 and the bridge member 1 serve to effectively hold a card designed in compliance with the CF Type standard if the outside size is 44.0 to 45.0 mm or thereabout conforming to the size of the card. On the other hand, the thickness L10 of the portion shown in FIG. 6(a) into which the additional card 30 is inserted is preferably 3.3 to 5.0 mm or thereabout to effectively hold a card designed in compliance with the CF Type standard.

If the PC card 1 in accordance with the first embodiment is designed to have the above outer dimensions, there is the advantage that a marketed card can be used as the additional card 30.

Figure 4:
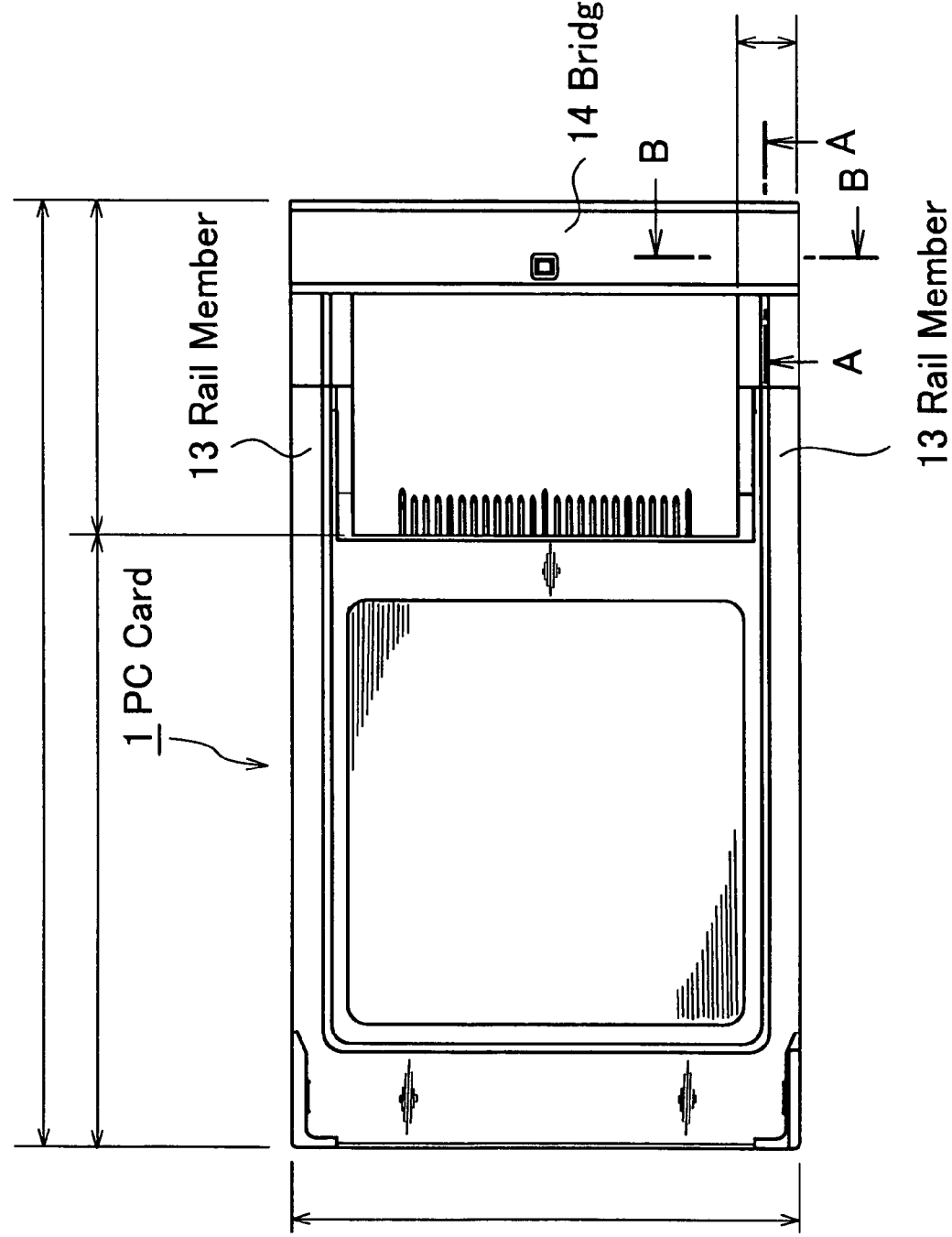
FIG. 4 is a view showing the PC card in accordance with the first embodiment as seen from the above.

On the other hand, the outer dimensions of the PC card 1 in accordance with the first embodiment is preferably in compliance with the PC card standard Type I, Type II and Type III. Because of this, in one preferred example, the length L2 of the shorter side as illustrated in FIG. 4 is 54.0 mm, and the thickness L7 of the PC card 1 as illustrated in FIG. 5(a) is 3.3 mm, 5.0 mm or 10.5 mm. On the other hand, the length L1 of the longer side as illustrated in FIG. 4 is preferably no shorter than 85.6 mm in order that it can be inserted into the information processing apparatus such as a PC, and optimally 100.0 to 105.0 mm or thereabout when taking into consideration the rail members 13 and the bridge member 14 provided for holding the additional card 30, user-friendliness in portability, and so forth.

Also, of the length L1 of the longer side, the length L4 of the portion into which the additional card 30 is inserted as illustrated in FIG. 4 is preferably 20.0 to 50.0 mm or thereabout in order to hold the additional card 30, and optimally 30.0 to 40.0 mm or thereabout when taking into consideration that the additional card 30 is in compliance with the CF Type standard. Also, of the length L1 of the longer side, the length L3 of the card main body 10 is preferably 60.0 to 70.0 mm or thereabout when taking into consideration that it is inserted into the information processing apparatus 20. Furthermore, taking into consideration that the additional card 30 is in compliance with the CF Type standard, the length L5 of the rail members 13 is preferably 5.0 to 6.0 mm.

Furthermore, the thickness L6 of the PC card inclusive of the bridge member 4 as illustrated in FIG. 5(a) is preferably 6.0 to 10.0 mm, and optimally 7.00 to 9.0 mm or thereabout when taking into consideration the easiness of designing and the user-friendliness in portability. Furthermore, the width L8 of the bridge member 4 is preferably 5.0 mm to 10.0 mm or thereabout for securing the stiffness of the frame member 13 and the facility of holding the additional card 30, and optimally 6.0 to 8.0 mm or thereabout when taking into consideration that some device such as an antenna structure may be implemented within the bridge member 4.

Since a conventional card can be inserted into the PC card 1 in accordance with the first embodiment, both the function of the PC card 1 and the function of the conventional card 30 as inserted thereinto can be added to the information processing apparatus 20 by the use of only one card slot 21 of the information processing apparatus 20. Also, by providing the bridge member 14, it is possible to secure the stiffness of the frame member 13 longitudinally extended in order that the additional card 30 is inserted into it, and also possible to enhance the facility of holding the additional card 30.

(Function of The PC Card)

The card main body 10 and the additional card 30 to be inserted into the card main body 10 are implemented with different capabilities among a wireless LAN capability, a PHS communication capability, a portable telephone communication capability, a memory capability and so forth. For example, the information processing apparatus 20 can provide both a wireless LAN capability and a PHS communication capability by making use of the card main body 10 in which the wireless LAN capability is implemented and the additional card 30 in which the PHS communication capability is implemented. In this case, if a wireless LAN service can be used, the information processing apparatus 20 starts communication through the wireless LAN, and if no wireless LAN service can be used, the information processing apparatus 20 can start communication by the PHS communication capability.

As thus described, in accordance with the PC card 1 of the first embodiment, it is possible to add multiple capabilities to the information processing apparatus 20 with the conventional card 30 only by the use of one card slot 21.

(Grounding Capability)

The frame member 13 of the PC card 1 in accordance with the first embodiment is provided inside thereof with a pair of flame ground contacts 16a for inserted card, in order to ground both the additional cards 30 and the PC card 1 at the same time.

Figure 3:
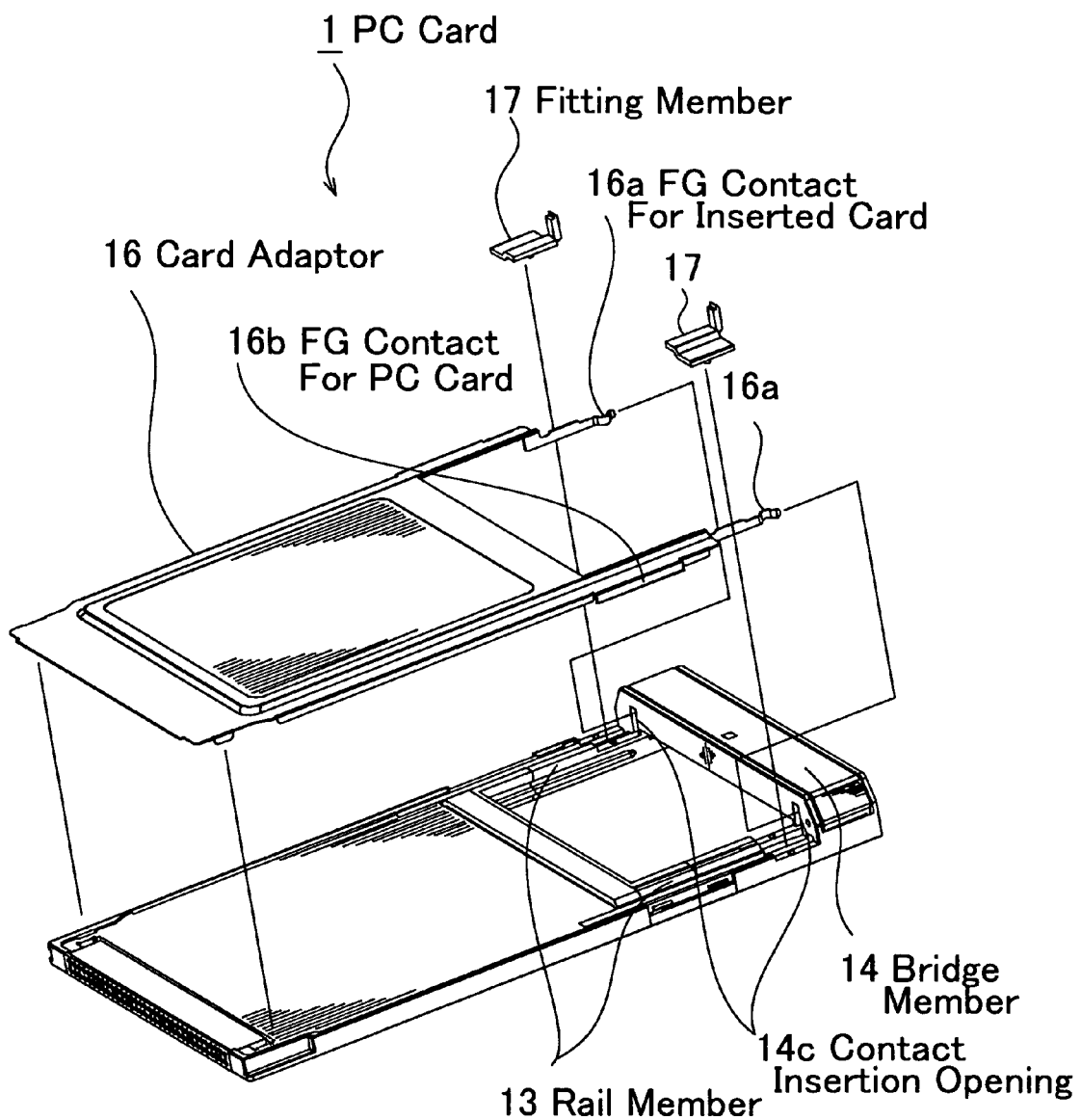
FIG. 3 is an exploded perspective view showing the PC card in accordance with the first embodiment.
Figure 5:
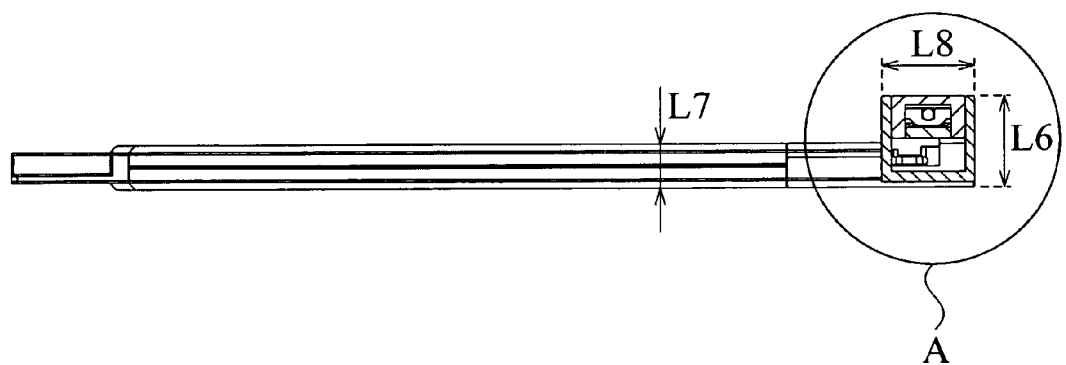
FIG. 5(a) is a cross sectional view taken along A-A line of FIG. 4.
FIG. 5(b) is an expanded view of the portion A shown in FIG. 5(a).
Figure 5:
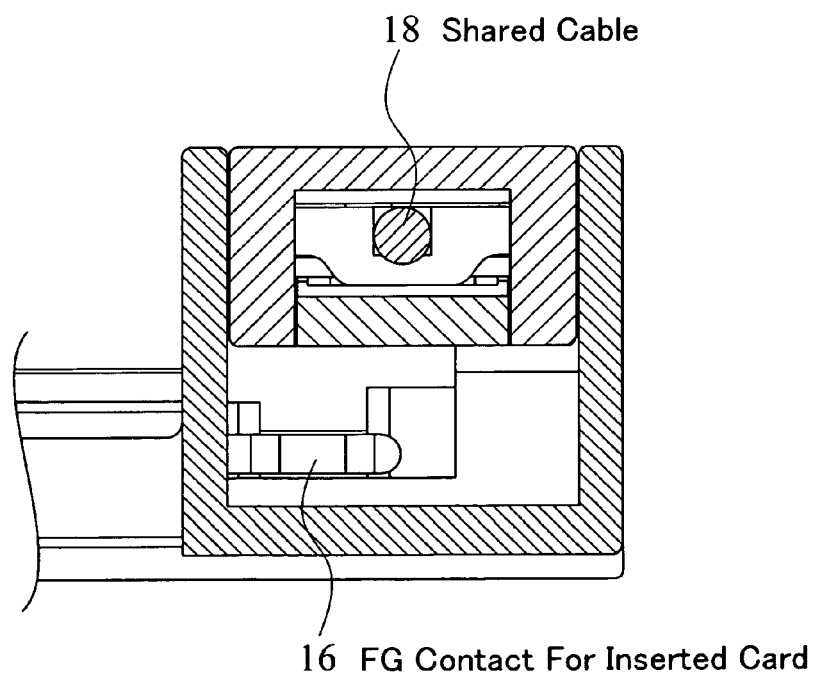
Figure 6:
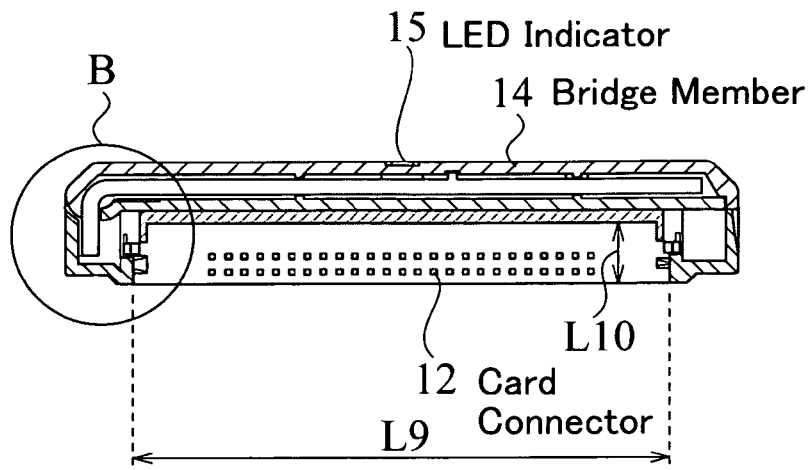
FIG. 6(a) is a cross sectional view taken along B-B line of FIG. 4.
FIG. 6(b) is an expanded view of the portion A shown in FIG. 6(a).
Figure 6:
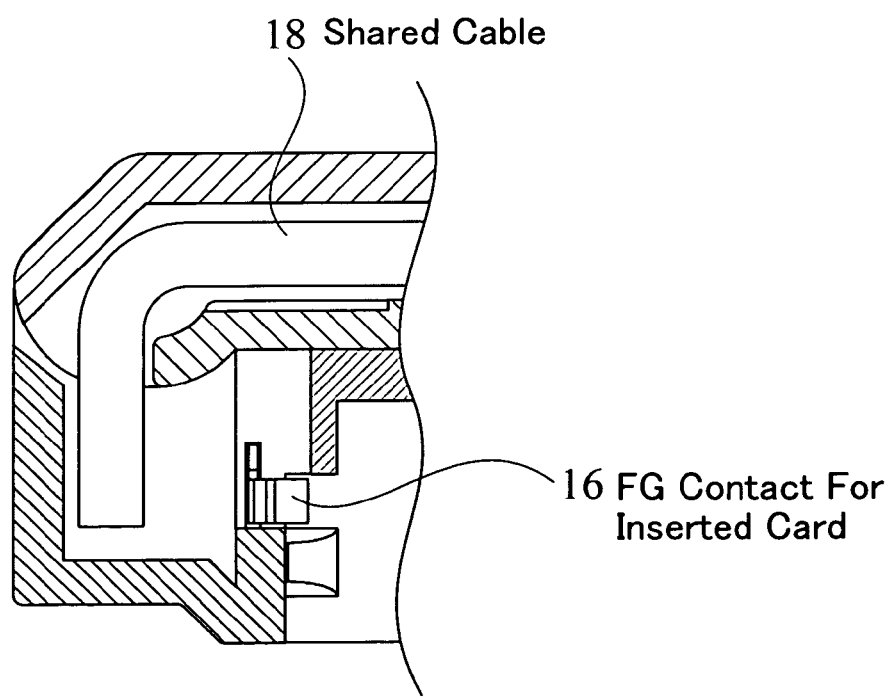

A card adaptor 16 covers the upper portions of the card main body and the rail members 13, and is provided with FG contacts 16b for PC card which are located over the outer sides longitudinally extended along the profile of the rail members 13 and the FG contacts 16a for inserted card which are located at the extended ends along the rail members 13 as illustrated in FIG. 3. When the FG contacts 16a for inserted card are inserted through contact insertion openings 14c and the card adaptor 16 is placed on the upper portion of the card main body, the FG contacts 16a for inserted card are located inside of the rail members 13 and the FG contacts 16b for PC card are located in the outer side surfaces of the rail members 13. After placing the card adaptor 16, the contact insertion openings 14c and the rail members 13 are covered with fitting members 17. In this state, the FG contacts 16a for inserted card are located in the position as illustrated in FIG. 5(*b*). Also, since the FG contacts 16a for inserted card are protruded from the rail members 13 as illustrated in FIG. 6(*b*), when the additional card 30 is inserted between the rail members 13, the FG contacts of the additional card 30 come in contact with the FG contacts 16a for inserted card.

When the additional card 30 is inserted into the PC card 1 in accordance with the first embodiment, the FG contacts of the inserted card 30 come in contact with the FG contacts 16a for inserted card.

On the other hand, when the PC card 1 in accordance with the first embodiment is inserted into the information processing apparatus 20, the PC card 1 is grounded by the FG contacts 16b for PC card which is grounded in turn by the information processing apparatus 20 connected thereto. The FG contacts 16a for inserted card and the FG contacts 16b for PC card are integrally formed by sheet metal processing, and therefore the additional card 30 as inserted and the PC card 1 can be grounded together. Incidentally, the locations and shapes of the FG contacts of a card in compliance with the CF Type I or CF Type II standard and the locations and shapes of the FG contacts of a PC card in compliance with the PC card Type I, Type II or Type III standard are determined by the standards, and therefore the FG contacts 16a for inserted card and the FG contacts 16b for PC card are designed in conformity with the locations and shapes.

The frame member 13 of the PC card 1 in accordance with the first embodiment is provided with the FG contacts 16a for inserted card and the FG contacts 16b for PC card as an integrated steel metal part of the card adaptor, and the cost of the parts can be reduced without the need for assembling process. Also, since the additional card 30 and the PC card 1 are grounded at the same time, for example, in the case where the card process high frequency signals, for example, the connection of the FG contacts is effective to stablize the high frequency process Furthermore, when the card is touched such that static electricity charged on the human body is discharged, the static electricity as discharged could damage electronic elements inside of the card. However, since the card is connected to the case of the PC through the FG contacts, harmful effects of the static electricity can be substantially lessened.

(Sharing a Cable In The Rail Members and The Bridge Member)

In the case where the PC card 1 in accordance with the first embodiment is provided with a communication capability, the bridge member 14 is preferably provided not only with an antenna structure but also with an LED indicator 15 as illustrated in FIG. 1. The LED indicator 15 serves to indicate the communication state, for example, by illuminating blue during communication, so that the user can visually confirm the current communication state.

In the case where the bridge member 14 is provided with the LED indicator 15, high frequency signals to/from the antenna structure and an LED lightening signal are transferred between the bridge member 14 and the card main body 10, and therefore a high frequency cable connected to the antenna structure and a power cable for lightening the LED have to be provided inside of the rail members 13 and the bridge member 14. However, since the width of the rail members 13 are limited, when the high frequency cable is placed, there is no space available for disposing the power cable for lightening the LED. The width L5 of the rail members 13 as illustrated in FIG. 4 is 5.0 to 6.0 mm or thereabout, and the thickness L7 thereof is 3.0 to 5.0 mm or thereabout. These are the outer dimensions of the rail members 13 so that the available internal space is more limited.

Accordingly, the same cable is used both as the high frequency cable and the power cable for lightening the LED in order to implement the functions of the antenna structure and LED indicator in the bridge member 14. The high frequency cable is used to transmit high frequency signals, and the power cable for lightening the LED is used basically to transmit a DC signal. It becomes possible to transmit two signals through a single shared cable by superimposing the high frequency signal and the DC signal. FIG. 5(a) is a cross sectional view taken along A-A line of FIG. 4, and FIG. 5(b) is an expanded view thereof showing a shared cable 18 which is provided in the bridge member 14 for transmitting the high frequency signal and the DC signal. Also, FIG. 6(a) is a cross sectional view taken along B-B line of FIG. 4, and FIG. 6(b) is an expanded view thereof showing the shared cable 18 which is provided in the frame member 13 and the bridge member 14. The diameter of the shared cable 18 is 1.0 to 3.0 mm or thereabout, and optimally 1.5 to 2.0 mm or thereabout when taking into consideration the easiness of designing and the production cost.

Since the PC card 1 in accordance with the first embodiment is provided with the shared cable 18 as described above, it is possible to transmit the high frequency signal and the LED lightening signal through the rail members 13 which is providing only a limited space available for wiring. By this configuration, the bridge member 14 can contain not only the antenna structure but also the LED indicator. In addition to this, it is possible to use only one cable for replacing two cables as needed in the conventional structure, and to reduce the parts cost of wirings and the number of steps for arranging wirings.

(Protection By Dummy Card)

As illustrated in FIG. 1, in the case of the PC card 1 in accordance with the first embodiment, the card connector 12 is a male connector which is exposed from the PC card 1.

A function which requires a larger space can be implemented inside of the card main body 10 by providing the card connector 12 outside of the card main body 10. However, in this condition, the card connector 12 could be damaged, and the foreign object could enter the PC card 1 through the card connector 12 to have harmful effect on the electronic circuits inside thereof.

For this reason, it is preferred to protect the card connector 12 by inserting a dummy card. If the additional card 30 is not inserted as illustrated in FIG. 2, the dummy card is inserted instead to provide a cover in the vertical and lateral directions of the card connector 12 and protect the contacts thereof. The dummy card serves to protect the card connector 12 and can be designed in any shape as long as it can be inserted between the rail members 13. The material therefor is preferably a cheap material, e.g., a metal, or a fluorine resin such as polypropylene (PP) or polytetrafluoroethylene (PTFE).

In the case of the PC card 1 in accordance with the first embodiment, the card connector 12 can be protected by providing this dummy card so that there is no harmful effect on the electronic circuits inside of the PC card 1. On the other hand, for example, when the PC card 1 is inserted into the information processing apparatus 20 without inserting the additional card 30, the appearance of the PC card can be improved from aesthetic point of view by inserting the dummy card.

Second Embodiment

In the explanation of the second embodiment, the antenna as implemented within the bridge member 14 in the case of the first embodiment is designed to be moved.

Figure 7:
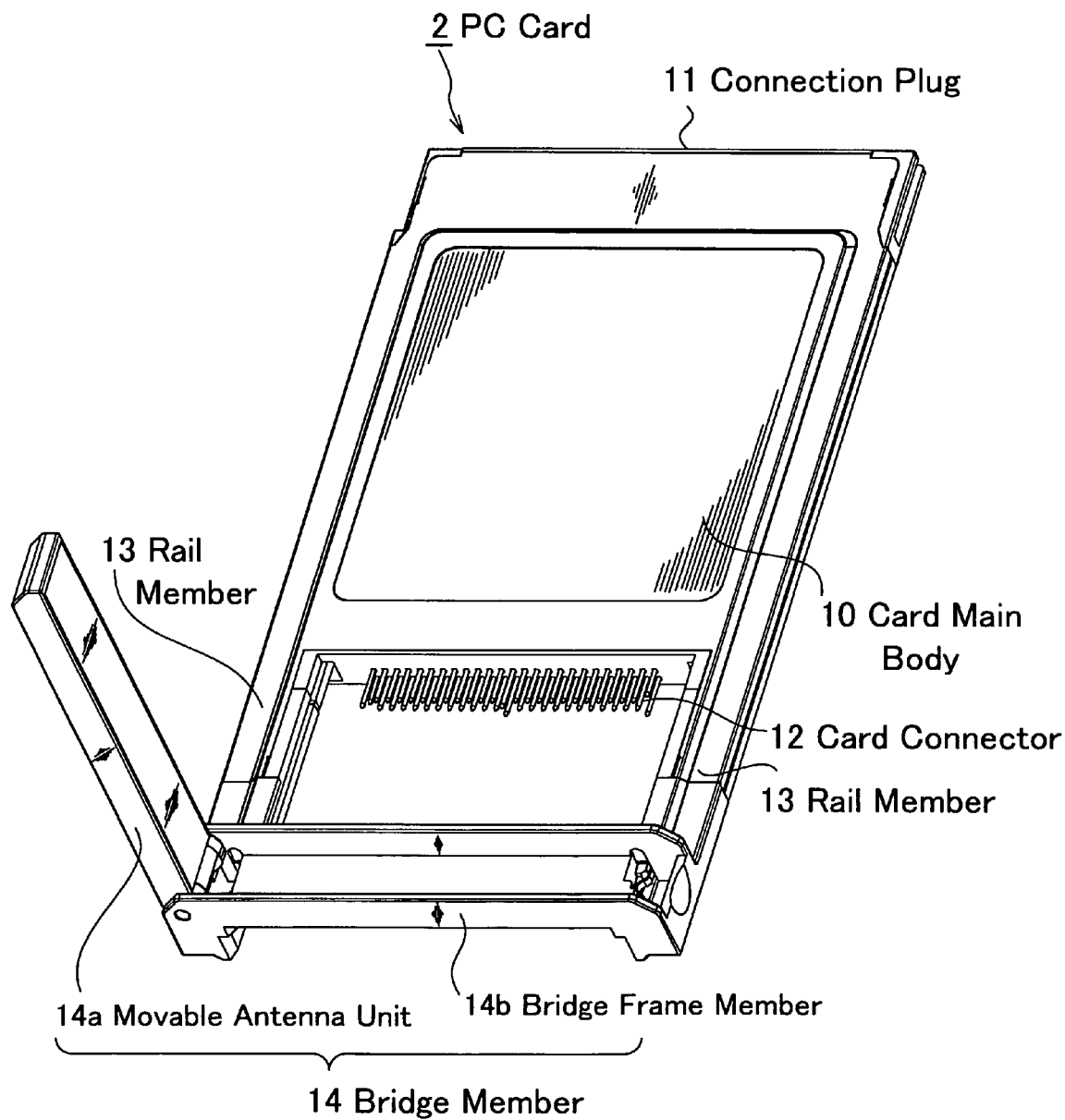
FIG. 7 is a perspective view showing a PC card in accordance with a second embodiment.

The PC card 2 in accordance with the second embodiment of the present invention comprises a card main body 10 to be inserted into a card slot of the information processing apparatus, a pair of parallel rail members 13, and a bridge member 14 with which the pair of the rail members 13 are connected as illustrated in FIG. 7. In the case of the second embodiment, the card main body 10 is provided with a communication capability such as a wireless LAN capability, a PHS communication capability, a portable telephone communication capability, or the like, and provided with an antenna structure in the bridge member 14.

The bridge member 14 comprises a movable antenna unit 14a serving as a wireless antenna, and a bridge frame member 14b connecting between the rail members 13. The movable antenna unit 14a has one end which is connected to the bridge frame member 14b and the other end which can come off the bridge frame member 14b and rotate to the upright position or a larger angular position. Also, the movable antenna unit 14a is provided with an LED indicator 15 in the same manner as that of the first embodiment.

The thickness of the bridge member 14 is greater than the thickness (L6 shown in FIG. 5(a)) of the bridge member in accordance with the first embodiment because there are the movable antenna unit 14a and the bridge frame member 14b. For example, the thickness of the bridge member 14 in accordance with the second embodiment is preferably 8.0 to 12.0 mm, and optimally 9.00 to 11.0 mm or thereabout when taking into consideration the easiness of designing and the user-friendliness in portability. The other outside dimensions are similar to those of the PC card 1 in accordance with the first embodiment, and therefore the explanation thereof is omitted. The outside dimensions of the additional card 30 are also similar to those of the PC card 1 in accordance with the first embodiment, and therefore the explanation thereof is omitted.

Incidentally, the PC card 2 in accordance with the second embodiment may be provided with the FG contacts 16a for inserted card inside of the rail members 13, and the shared cable 18 inside of the rail members 13 and the movable antenna unit 14a, and provided with the dummy card, in the same manner as explained in conjunction with the first embodiment. Also, the functions of the card main body 10, the rail members 13, the bridge member 14 and the like are similar to those of the first embodiment.

In accordance with the PC card 2 of the second embodiment, the radio receiving condition can be improved by setting the movable antenna unit 14a in the upright position. Also, the LED indicator 15 is located on the movable antenna unit 14a so that the LED indicator 15 is also movable, and therefore it is possible to improve the visibility of LED indication.

Other Embodiments

While the present invention has been described in conjunction with the above embodiments, the present invention should not be limited to the description and drawings as part of the disclosure. Various alternative embodiments, practical applications and implementations will be apparent to those skilled in the art from the disclosure.

For example, while the additional card 30 as an example for explanation is in compliance with the CF Type standard in the case of the embodiments of the present invention, the PC cards 1 and 2 in accordance with the present invention can be used with a card, even if it is in compliance with another standard and cannot be attached directly to the PC cards 1 and 2, as long as an appropriate adaptor is available through which the card can be connected to the card connector 12.

Needless to say, like this example, a variety of embodiments of the present invention are possible even if not described here. Accordingly, the present invention should be limited only by matters defining an invention in the claims which are appropriate from the view point of the description.

INDUSTRIAL APPLICABILITY

In accordance with the present invention, it is possible to provide a PC card which can be used to add multiple capabilities to an information processing apparatus in cooperation with a conventional card only by the use of a single card slot.

What is claimed is:

1. A PC card comprising:
   a card main body having a connection plug connectable to an information processing apparatus, and a card connector through which an additional card can be connected to add multiple capabilities to said information processing apparatus;
   a pair of parallel rail members configured to guide said additional card for insertion;
   a bridge member connected between said pair of parallel rail members in order not to block the insertion path; and
   said card main body is provided with a radio communication capability, and wherein
   said bridge member is provided with a wireless antenna, and
   said rail members are provided with a flame ground contact for an inserted card which comes in contact with a flame ground contact of said additional card and said wireless antenna, and serves to ground said additional card and said wireless antenna to said information processing apparatus.

2. The PC card as claimed in claim 1 wherein
   said bridge member is provided with an LED indicator, and wherein
   said rail members and said bridge member are provided therein with a single shared cable for high frequency signals to be connected to said wireless antenna, and a wiring for the LED indicator, wherein said high frequency signal for said radio communication capability and a DC signal for said LED indicator are transmited through said single shared cable by superimposing.

3. The PC card as claimed in claim 1 wherein said bridge member comprises:
   a movable antenna unit provided with said wireless antenna; and
   a bridge frame member configured to connect between said rail members.

4. The PC card as claimed in claim 1 wherein said additional card is a PHS card.

5. The PC card as claimed in claim 1 wherein said card connector is a male connector, and wherein the PC card is provided further with a dummy card having the same shape as said additional card and serving to protect said card connector.

* * * * *